United States Patent
Strulovici

(10) Patent No.: US 12,032,015 B1
(45) Date of Patent: Jul. 9, 2024

(54) FLEXIBLE INPUT/OUTPUT (I/O) ALLOCATION FOR INTEGRATED CIRCUIT SCAN TESTING

(71) Applicant: Amazon Technologies, Inc., Seattle, WA (US)

(72) Inventor: Ilan Strulovici, Keisarya (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 18/055,762

(22) Filed: Nov. 15, 2022

(51) Int. Cl.
  *G01R 31/28* (2006.01)
  *H01L 21/66* (2006.01)

(52) U.S. Cl.
  CPC ..... *G01R 31/2851* (2013.01); *G01R 31/2831* (2013.01); *G01R 31/2834* (2013.01); *G01R 31/2884* (2013.01); *G01R 31/2886* (2013.01); *H01L 22/34* (2013.01); *H01L 2924/00* (2013.01); *H01L 2924/0002* (2013.01)

(58) Field of Classification Search
  CPC ............ G01R 31/2851; G01R 31/2834; G01R 31/2884; G01R 31/2886; G01R 31/2831; H01L 2924/00; H01L 2924/0002; H01L 22/34

USPC .................................................. 324/762.01
See application file for complete search history.

(56) References Cited

U.S. PATENT DOCUMENTS

| | | | | |
|---|---|---|---|---|
| 2002/0170010 | A1* | 11/2002 | Saxena | G01R 31/31721 714/726 |
| 2006/0017453 | A1* | 1/2006 | Whetsel | G01R 31/31919 324/750.3 |
| 2008/0136438 | A1* | 6/2008 | Whetsel | G01R 31/318555 324/762.02 |
| 2012/0137187 | A1* | 5/2012 | Jain | G01R 31/318566 714/E11.155 |
| 2013/0111285 | A1* | 5/2013 | Chakravarty | G01R 31/318541 714/E11.155 |

* cited by examiner

*Primary Examiner* — Raul J Rios Russo
(74) *Attorney, Agent, or Firm* — Weaver Austin Villeneuve & Sampson LLP

(57) ABSTRACT

Flexible input/output (I/O) allocation techniques for integrated circuit scan testing are disclosed. The techniques implement configurable definition of the core circuitry blocks comprising the scan domain under test and their mapping to the scan test pads. Scan testing of the scan domain is performed by receiving a test pattern on the set of one or more scan-in test pads, transmitting the test pattern to the scan domain via the set of one or more scan input channels, receiving a test response on the set of one or more scan output channels, and transmitting the test response to the set of one or more scan-out test pads.

23 Claims, 9 Drawing Sheets

FLEXIBLE INPUT/OUTPUT (I/O) ALLOCATION FOR INTEGRATED CIRCUIT SCAN TESTING

BACKGROUND

In design for testability (DFT) applications, integrated circuits are often designed with scan test circuitry that is used during chip manufacturing to test for various internal fault conditions. The scan test circuitry on an integrated circuit can perform scan testing of scan domains comprising sets of core circuitry blocks of the integrated circuit. Scan testing a scan domain can involve transmitting a test pattern to the scan domain, receiving a test response from the scan domain, and determining whether fault(s) are present within the scan domain based on whether the test response matches an expected response.

BRIEF DESCRIPTION OF THE DRAWINGS

Various embodiments in accordance with the present disclosure will be described with reference to the drawings, in which.

DETAILED DESCRIPTION

Figure 1:
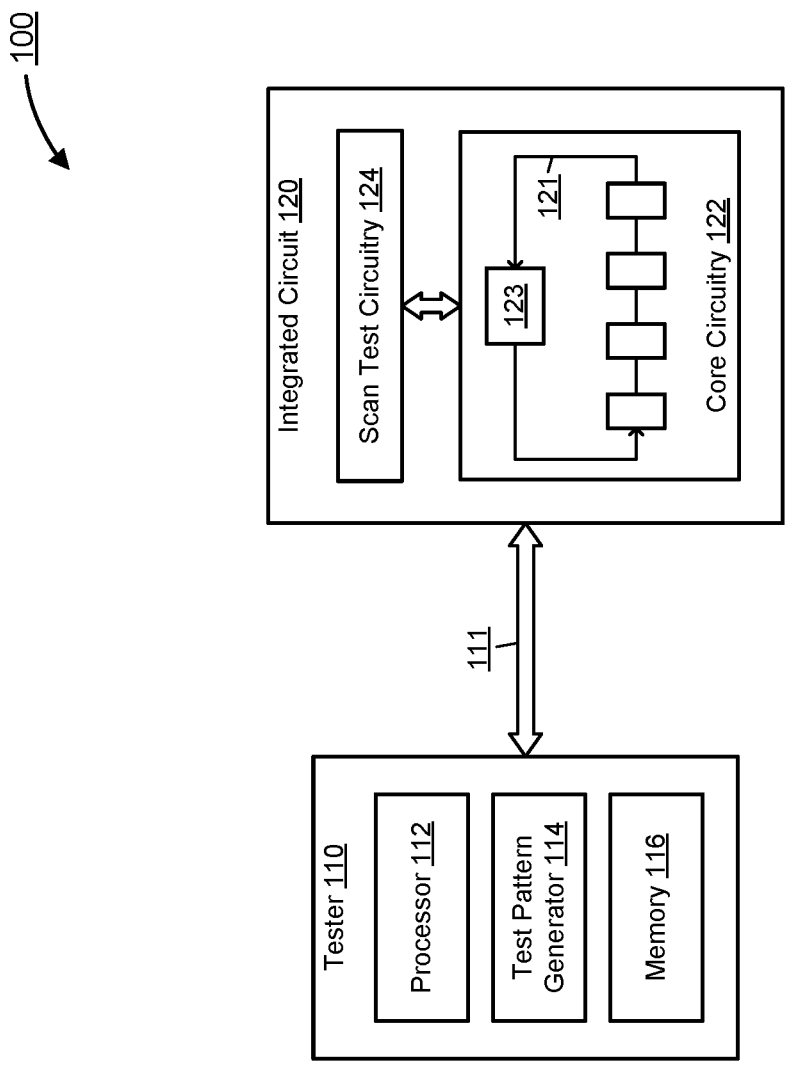
FIG. 1 is a block diagram of an example integrated circuit testing system.

Scan testing is a technique that can be used to check for faults in core circuitry of an integrated circuit. Features supporting scan testing can be incorporated into the integrated circuit architecture during the design phase. Such features can include scan-in test pads and scan-out test pads via which the integrated circuit can receive test patterns from, and output test responses to, a tester device (e.g., an external tester). Some of I/Os used during normal operation of the integrated circuit can be repurposed into the scan-in test pads and scan-out test pads during test mode. The integrated circuit can also include scan input channels and scan output channels that can convey test patterns to, and convey test responses from, core circuitry blocks of the integrated circuit and/or scan domains comprising such core circuitry blocks.

In addition to the above, the integrated circuit can include scan test circuitry that generally serves as a communicative intermediary between the scan-in test pads and the scan input channels, and between the scan output channels and the scan-out test pads. In conjunction with this role, the scan test circuitry can provide communicative coupling between a scan-in test pad and a scan input channel of a scan domain and/or a core circuitry block, so that a test pattern or other signal received from the tester (or any other source) via the scan-in test pad is conveyed to the scan input channel and onto the scan domain and/or a core circuitry block. Similarly, the scan test circuitry can provide communicative coupling between a scan output channel of a scan domain and/or a core circuitry block and a scan-out test pad, so that a test response that the scan domain outputs on the scan output channel is conveyed to the scan-out test pad and on to the tester (or any other destination).

According to one approach, the scan test circuitry can be configured to statically couple scan-in test pads with scan input channels, and scan output channels with scan-out test pads. However, due to design constraints, these static couplings may typically be defined during early stages of the design process. Design choices made during later stages of development or during production can potentially render the particular statical couplings defined during earlier stages of development sub-optimal, and scan testing of the integrated circuit can be negatively impacted with respect to testing time and/or cost. Further negative impacts can result from the lack of flexibility afforded for handling power issues, crosstalk issues, I/O issues, and/or other issues that may be encountered during production stage scan testing (or any other stage of scan testing).

According to techniques described herein, an integrated circuit can be configured with scan test circuitry that flexibly maps scan-in test pads to scan input channels and scan output channels to scan-out test pads according to a configurable mapping scheme (together and/or separately). According to aspects of the disclosure, the scan test circuitry can be configured to implement pad-channel communicative coupling according to a scan configuration that defines a current mapping of a configurable mapping scheme, and the current mapping can be reconfigured by modifying the scan configuration.

According to aspects of the disclosure, the scan configuration can be stored in a set of configuration registers and/or memory elements. In various implementations, the set of configuration registers can include a respective configuration register for each scan-in test pad of the integrated circuit and a respective configuration register for each output scan channel implemented in the integrated circuit. In various implementations, it may be possible for the scan test circuitry to establish communicative coupling between any particular scan-in test pad and any particular scan input channel—or between any particular scan output channel and any particular scan-out test pad—by setting values/states of the appropriate configuration registers.

Such programmable I/O allocation capabilities may lend flexibility to the allocation of core circuitry blocks of the integrated circuit to scan domains. This flexibility may reduce the design burden associated with allocating blocks to scan domains, and can enable optimization of the scan test suite (e.g., with respect to test volume, power, cost, time and/or any other issue requiring remap) at any stage throughout the device lifetime.

In the following description, various examples will be described. For purposes of explanation, specific configurations and details are set forth in order to provide a thorough understanding of the examples. However, it will also be apparent to one skilled in the art that the example may be practiced without the specific details. Furthermore, well-known features may be omitted or simplified in order not to obscure the embodiments being described.

FIG. 1 is a block diagram of an example integrated circuit testing system 100. FIG. 1 shows an integrated circuit testing system 100 including a tester 110 and an integrated circuit 120 that is coupled to the tester 110 through an interface 111. The tester 110 can be an automated test equipment (ATE) that can include a processor 112, a test pattern generator 114, and a memory 116, etc. The processor 112 can use the test pattern generator 114 to perform various forms of scan testing and functional mode testing of the integrated circuit. The test pattern generator 114 can include software modules that are executed within the processor 120. Alternatively, the test pattern generator 114 can be implemented using dedicated logic circuits and firmware.

As further shown in FIG. 1, the integrated circuit 120 can include a core circuitry 122 and a scan test circuitry 124, among other components and blocks. The scan test circuitry 124 is coupled to the internal core circuitry 122 for scan testing the internal core circuitry (e.g., processors, memory blocks, other combinatorial logic circuits, etc.) using the scan test circuitry 124. In an embodiment, the core circuitry 122 can have one or more scan chains 121 including multiple scan cells 123. The scan test circuitry 124 can implement a scan test protocol and other test modes of operation (e.g., standard scan testing, built-in-self-test (BIST) testing, and functional mode testing operations, etc.) using test patterns generated by the test pattern generator 114 of the tester 110. The scan test data generated by the scan test circuitry 124 can be accessed by the tester 110 through the interface 111.

Figure 2:
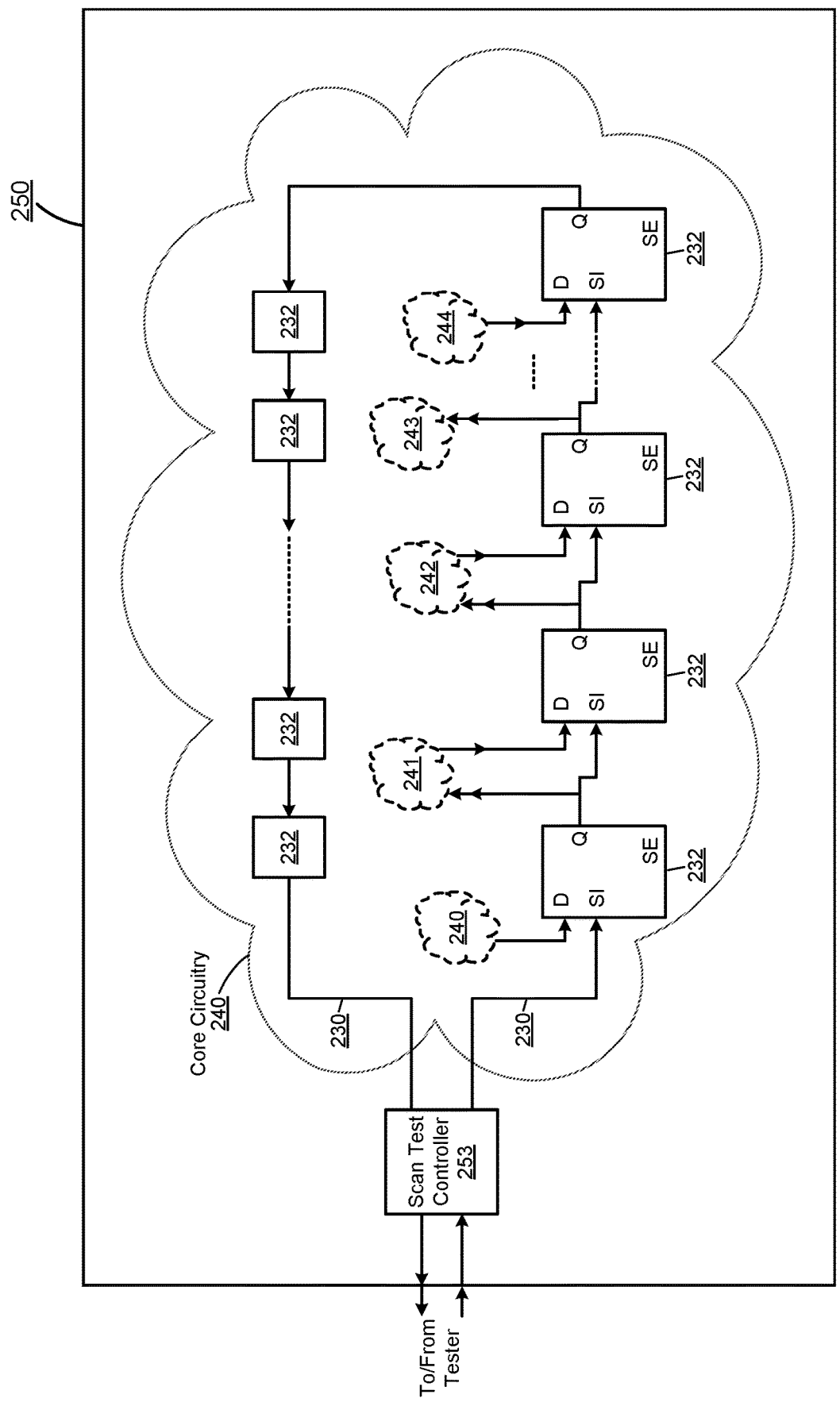
FIG. 2 is a block diagram illustrating a portion of an integrated circuit including a scan chain.

FIG. 2 is a block diagram illustrating a portion of an integrated circuit 250 including a scan chain 230. Scan chain 230 includes a plurality of scan cells 232 that are coupled with various circuit blocks of a core circuitry 240 that is under test. Each scan cell 232 can be a scan flip-flop (SFF) with a data (D) input port, a scan input (SI) port, a data (Q) output port, and scan enable (SE) control port. Each scan cell 232 also has a clock (CLK) input port, which is not shown to simplify the drawing. Integrated circuit 250 can have a number of scan chains, and the number of scan cells in each scan chain can vary depending on the type of integrated circuit to be tested and the target test applications.

Core circuitry 240 represents functional blocks in the core design part, and can include scan cells 232. In the example of FIG. 2, circuit blocks 241, 242, 243, and 244 in core circuitry 240 are arranged between the Q output port of one scan cell 232 and the D input port of an adjacent downstream scan cell 232 in the scan chain 230. Moreover, the Q output port of one scan cell 232 is connected to the SI port of an adjacent downstream scan cell 232 in the scan chain 230. Other implementations may include different port names and/or other logic to implement the selection between functional data and scan data into the memory element. The first scan input (SI) port of the first scan cell 232 in the scan chain 230 is connected to a scan test controller 253 and/or connected directly outside the core to receive scan-in data. The Q output port of the last scan cell 232 in the scan chain 230 is connected to the scan test controller 253 and/or connected directly outside the core to provide scan-out data. The circuit blocks 241-244, etc., can include other types of functional logic circuitry or combinatorial logic blocks, depending on the architecture and function of the integrated circuit.

The scan enable (SE) signal determines whether the device is in a functional mode or a shift mode. In the functional mode, the D input of the scan cell 232 gets data input from a functional unit. In the shift mode enabled by the SE signal, the SI input the scan cell 232 gets scan test input. The scan test result data can be shifted out of the scan chain 230 through the scan test controller and/or directly to the external tester.

Figure 3A:
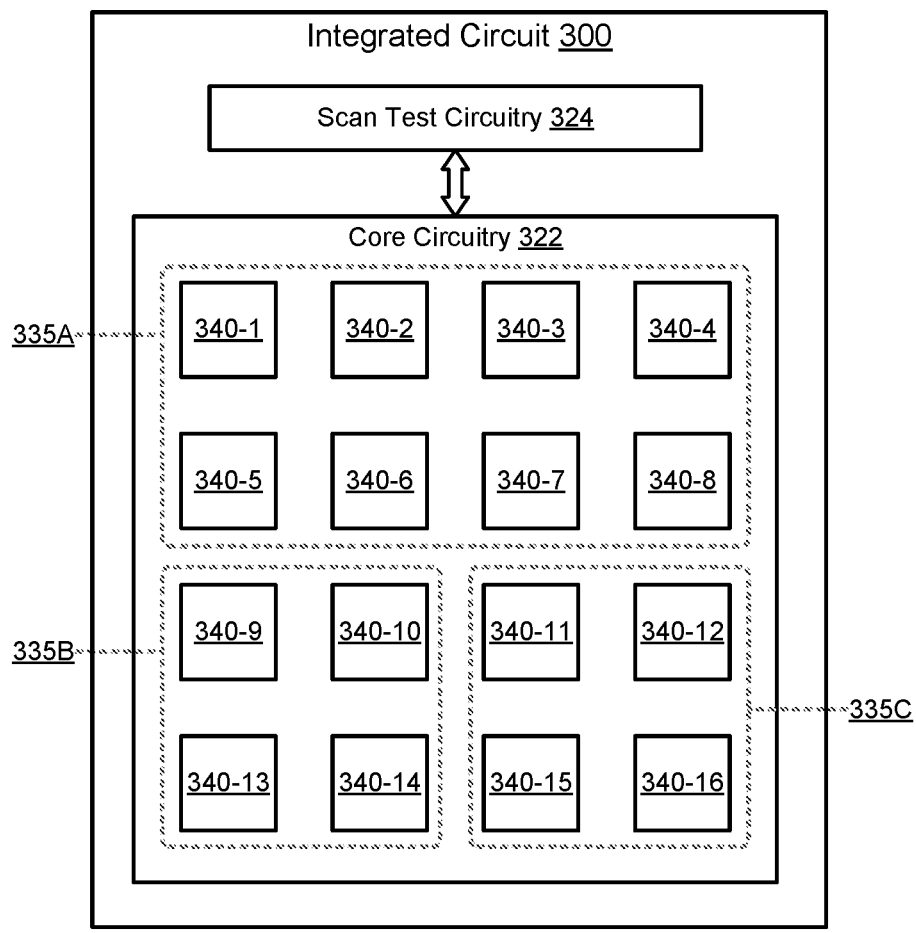
FIG. 3A is a block diagram illustrating an example scan domain arrangement.

FIG. 3A is a block diagram illustrating an example scan domain arrangement for an integrated circuit 300. Integrated circuit 300 includes core circuitry 322 and scan test circuitry 324. According to aspects of the disclosure, integrated circuit 300 can be used to implement integrated circuit 120 of FIG. 1. According to some such implementations, core circuitry 322 can correspond to core circuitry 122 of FIG. 1, and scan test circuitry 324 can correspond to scan test circuitry 124 of FIG. 1.

Core circuitry 322 can include a plurality of core circuitry blocks. In the particular example depicted in FIG. 3A, core circuitry 322 includes sixteen core circuitry blocks 340-1 to 340-16. Each core circuitry block 340-1 to 340-16 can comprise a respective portion of functional logic circuitry or combinatorial logic within the core circuitry 322 of integrated circuit 300. The types of functional logic circuitry or combinatorial logic that may be comprised in core circuitry blocks 340-1 to 340-16 can depend on the architecture and function(s) of integrated circuit 300. In some implementations, one or more of core circuitry blocks 340-1 to 340-16 can be processing circuitry blocks and/or can include processing circuitry. In some implementations, one or more of core circuitry blocks 340-1 to 340-16 can be memory circuitry blocks and/or can include memory circuitry. In some implementations, one or more of core circuitry blocks 340-1 to 340-16 can include a combination of processing circuitry and memory circuitry.

According to the example scan domain arrangement shown in FIG. 3A, three scan domains 335A, 335B, and 335C are defined, each of which includes a respective set of core circuitry blocks among the core circuitry blocks 340-1 to 340-16 of core circuitry 322. Scan domain 335A includes eight core circuitry blocks—core circuitry blocks 340-1 to 340-8. Scan domain 335B includes four core circuitry blocks—core circuitry blocks 340-9, 340-10, 340-13, and 340-14. Scan domain 335C also includes four core circuitry blocks—core circuitry blocks 340-11, 340-12, 340-15, and 340-16. It is to be appreciated that although each core circuitry block of core circuitry 322 is allocated to a scan domain in the example shown in FIG. 3A, according to some implementations, some core circuitry blocks may not be allocated to any scan domain, and some may be allocated to more than one domain. Further, according to aspects of the disclosure, core circuitry 322 may include a greater or lesser number of core circuitry blocks, and/or a scan domain arrangement may be implemented that defines a greater or lesser number of scan domains.

According to techniques described herein, rather than being statically configured, scan domains such as those shown in FIG. 3A can be dynamically created and modified such that the same (or different) set of I/Os can be flexibly allocated for scan testing of different sets of core circuitry blocks. For example, when there are insufficient I/Os to test every core circuitry block of a chip, a scan domain can be created to include certain core circuitry blocks for testing with a set of I/Os, Subsequently, another scan domain can be created to include other core circuitry blocks for testing with the same set of I/Os. Hence, the scan domains of a chip need not be fixed at the chip design phase, and can be dynamically modified after tapeout.

Figure 3B:
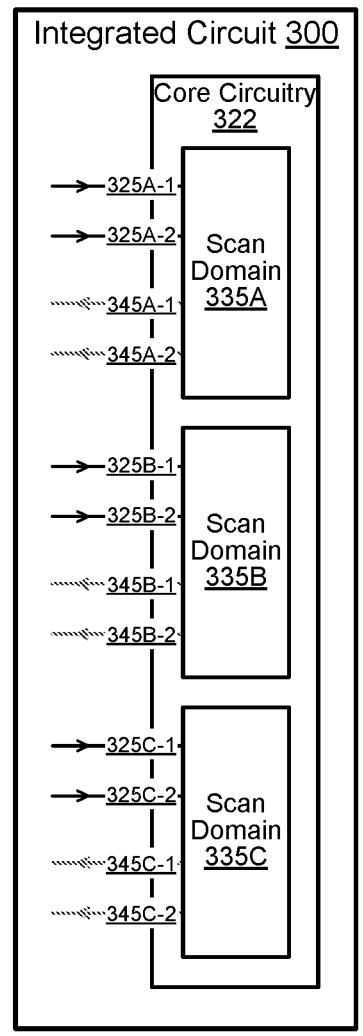
FIG. 3B is a block diagram illustrating an example scan domain arrangement.

FIG. 3B is a block diagram illustrating an example scan domain arrangement that establishes scan input channels and scan output channels to support scan testing of the scan domains 335A, 335B, and 335C defined in FIG. 3A. For each of scan domains 335A, 335B, and 335C, the scan domain arrangement shown in FIG. 3B establishes two scan input channels and two scan output channels. Namely, the scan domain arrangement provides scan domain 335A with scan input channels 325A-1 and 325A-2 and scan output channels 345A-1 and 345A-2, provides scan domain 335B with scan input channels 325B-1 and 325B-2 and scan output channels 345B-1 and 345B-2, and provides scan domain 335C with scan input channels 325C-1 and 325C-2 and scan output channels 345C-1 and 345C-2.

According to aspects of the disclosure, scan domains 335A, 335B, and 335C can be configured to receive test patterns for scan testing via any combination of scan input channels 325A-1 and 325A-2, scan input channels 325B-1 and 325B-2, and scan input channels 325C-1 and 325C-2. Scan domains 335A, 335B, and 335C can be configured to output test responses based on the test patterns via any combination of scan output channels 345A-1 and 345A-2, scan output channels 345B-1 and 345B-2, and scan output channels 345C-1 and 345C-2. It is worthy of note that the respective numbers of scan input channels and scan output channels established for the various scan domains need not necessarily be the same, though they happen to be in the depicted example.

Furthermore, according to the aspects of the disclosure, controllability of the number of scan input channels and/or scan output channels allocated per core circuitry under a scan domain is also available, supporting different scan flavors of a core circuitry—from maximum channels number scan to minimum channels number scan supported by the core circuitry.

Figure 4:
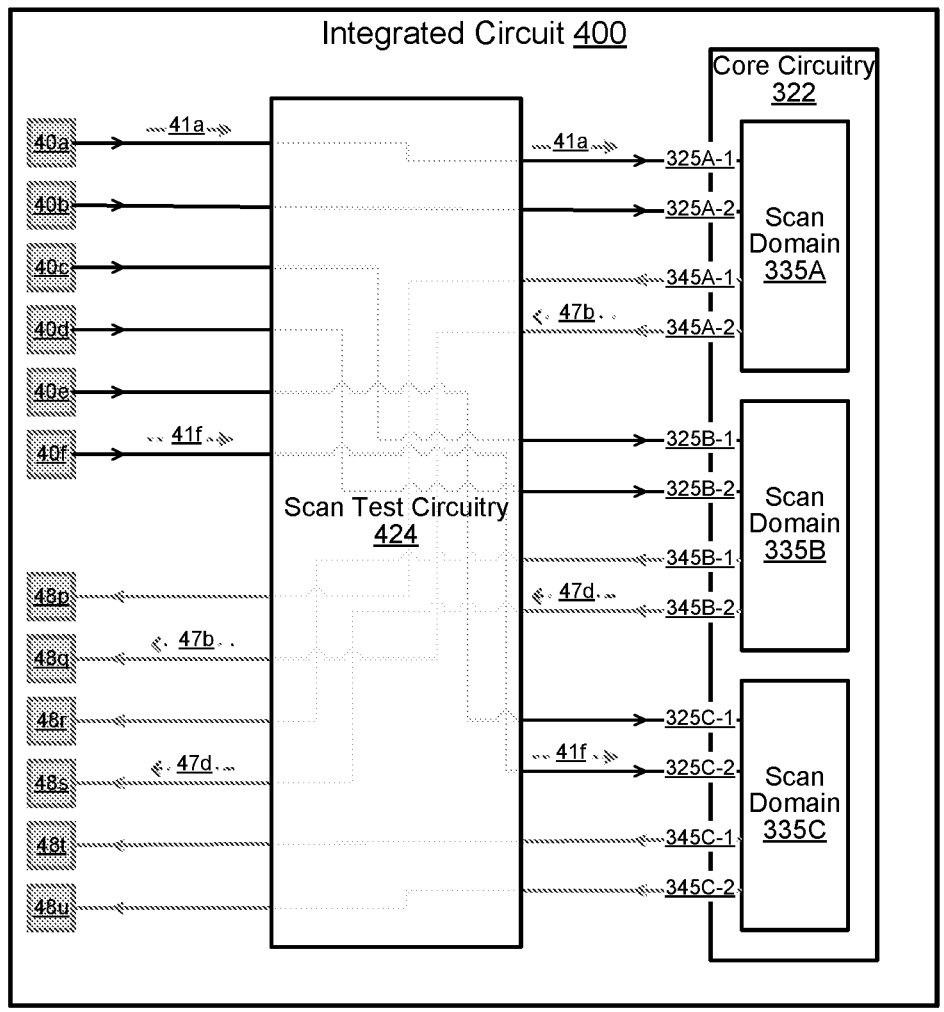
FIG. 4 is a block diagram of a first example integrated circuit.

FIG. 4 is a block diagram of a first example integrated circuit 400. Integrated circuit 400 includes the core circuitry 322 of integrated circuit 300 of FIGS. 3A and 3B. Integrated circuit 400 also includes scan test circuitry 424, six scan-in test pads 40a to 40f, and six scan-out test pads 48p to 48u. In various implementations, integrated circuit 400 can include greater or lesser numbers of scan-in test pads and scan-out test pads. Furthermore, the respective numbers of scan-in test pads and scan-out test pads included in integrated circuit 400 need not necessarily be the same. In some implementations, integrated circuit 400 may include a greater number of scan-in test pads than scan-out test pads. In some other implementations, integrated circuit 400 may include a greater number of scan-out test pads than scan-in test pads.

Integrated circuit 400 implements the scan domain arrangement illustrated in FIG. 3A, which defines scan domains 335A, 335B, and 335C, each of which includes a respective set of core circuitry blocks among the core circuitry blocks of core circuitry 322. Integrated circuit 400 also implements the scan domain arrangement illustrated in FIG. 3B, which provides scan domain 335A with scan input channels 325A-1 and 325A-2 and scan output channels 345A-1 and 345A-2, provides scan domain 335B with scan input channels 325B-1 and 325B-2 and scan output channels 345B-1 and 345B-2, and provides scan domain 335C with scan input channels 325C-1 and 325C-2 and scan output channels 345C-1 and 345C-2.

Integrated circuit 400 can be configured to receive test patterns for scan testing via scan-in test pads 40a to 40f, and to output test responses based on the test patterns via scan-out test pads 48p to 48u. In some implementations, integrated circuit 400 can be communicatively coupled with a tester (e.g., tester 110 of FIG. 1) that generates the test patterns. In some implementations, integrated circuit 400 can receive the test patterns from the tester via scan-in test pads 40a to 40f, and can output the test responses to the tester via scan-out test pads 48p to 48u. In some implementations, the tester can be an automated test equipment (ATE).

As one of its functions, scan test circuitry 424 provides communicative coupling of scan-in test pads of integrated circuit 400 with scan input channels of scan domains 335A, 335B, and 335C, and of scan output channels of scan domains 335A, 335B, and 335C with scan-out test pads of integrated circuit 400. The communicative coupling that scan test circuitry 424 provides is static, such that scan-in test pads are statically communicatively coupled with particular scan input channels, and scan output channels are statically communicatively coupled with particular scan-out test pads. For instance, scan-in test pads 40a and 40f are statically communicatively coupled with scan input channels 325A-1 and 325C-2, respectively. Thus, scan test circuitry 424 will convey a signal 41a received via scan-in test pad 40a to scan input channel 325A-1, and will convey a signal 41f received via scan-in test pad 40f to scan input channel 325C-2. Similarly, scan output channels 345A-2 and 345B-2 are statically communicatively coupled with scan-out test pads 48q and 48s, respectively. Thus, scan test circuitry 424 will convey a signal 47b received via scan output channel 345A-2 to scan-out test pad 48q, and will convey a signal 47d received via scan output channel 345B-2 to scan-out test pad 48s. Selection between the different scan domains to be tested each time may be done by I/Os, programmable registers or any other means.

Due to design constraints, decisions regarding the allocations of core circuitry blocks to scan domains, the establishment of scan input channels and scan output channels for the scan domains, and the static mappings of scan-in test pads and scan-out test pads to those scan input channels and scan output channels may generally be made at a relatively early stage of the design process for integrated circuit 400. This can result in non-optimal test volume for each scan domain, as the actual pattern count per core circuitry block and the maximum scan chain length may not be finalized until latter stages of the design process or until stages of the subsequent production process. Such non-optimal test volume can negatively impact scan testing of integrated circuit 400 both with respect to testing time and with respect to testing cost. Furthermore, little flexibility may be afforded for handling power issues that may be encountered during production stage scan testing. If, due to limitations imposed by such a power issue, the maximum number of blocks that can be simultaneously scanned per scan domain is less than the number of blocks in a given scan domain, multiple test iterations may be needed to complete the scan testing of that scan domain, imposing additional costs with respect to test volume and time.

Other issues requiring flexibility in allocation of core circuitry under a scan domain may be due to core instances crosstalk, I/Os issues requiring avoiding certain I/Os during scan test, etc.

Figure 5:
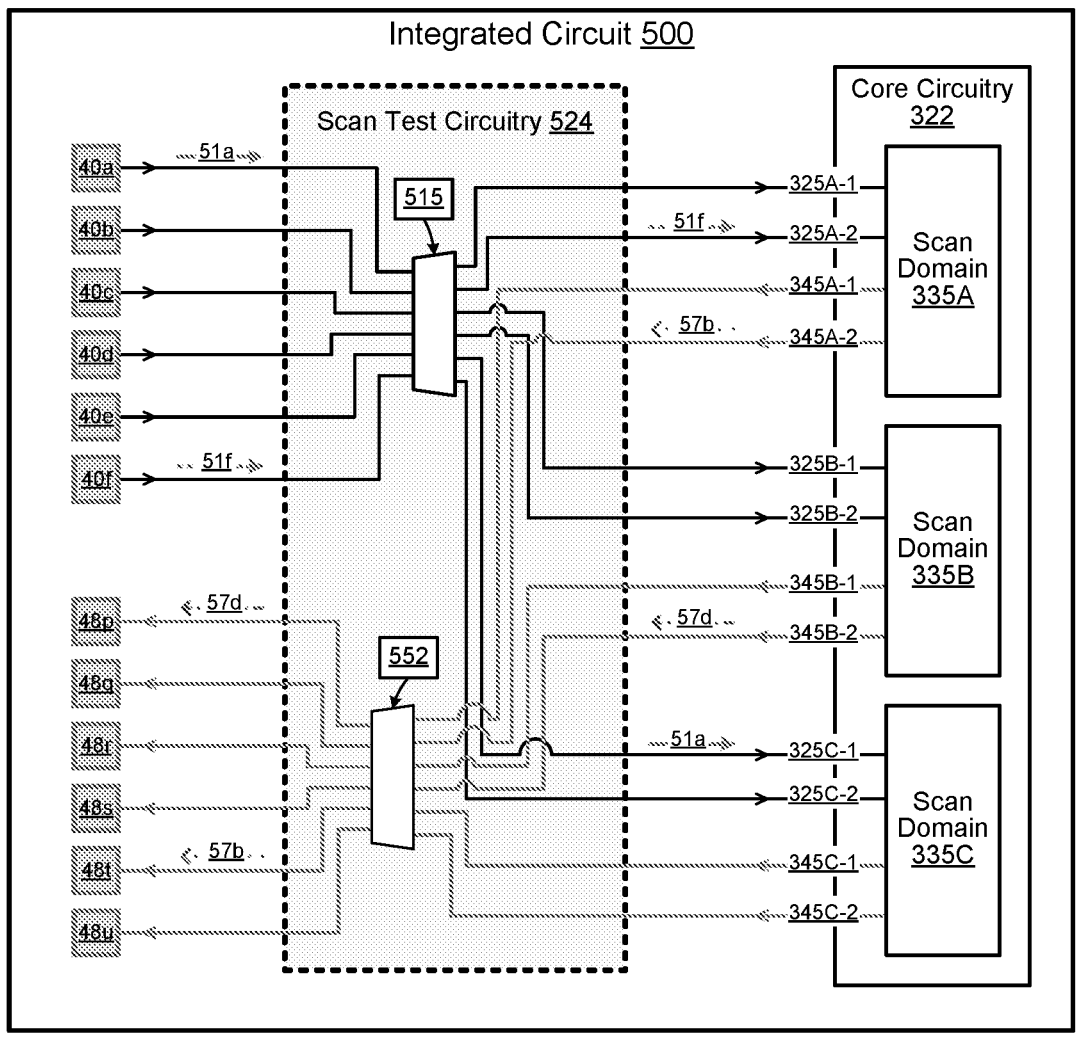
FIG. 5 is a block diagram of a second example integrated circuit.

FIG. 5 is a block diagram of a second example integrated circuit 500. Integrated circuit 500 includes the same core circuitry 322 as integrated circuit 300 of FIGS. 3A and 3B and integrated circuit 400 of FIG. 4 and includes the same scan-in test pads 40a to 40f and scan-out test pads 48p to 48u as integrated circuit 400 of FIG. 4. In the example shown in FIG. 5, integrated circuit 500 implements the same scan domain arrangement as that implemented by integrated circuit 400 in FIG. 4, which defines scan domains 335A, 335B, and 335C. Like integrated circuit 400 in FIG. 4, integrated circuit 500 implements the scan domain arrangement illustrated in FIG. 3B, which provides scan domain 335A with scan input channels 325A-1 and 325A-2 and scan output channels 345A-1 and 345A-2, provides scan domain 335B with scan input channels 325B-1 and 325B-2 and scan output channels 345B-1 and 345B-2, and provides scan domain 335C with scan input channels 325C-1 and 325C-2 and scan output channels 345C-1 and 345C-2.

Integrated circuit 500 also includes scan test circuitry 524. Like scan test circuitry 424 of FIG. 4, scan test circuitry 524 provides communicative coupling of scan-in test pads with scan input channels of scan domains 335A, 335B, and 335C, and of scan output channels of scan domains 335A, 335B, and 335C with scan-out test pads. However, unlike scan test circuitry 424, which statically maps scan-in test pads to scan input channels and scan output channels to scan-out test pads, scan test circuitry 524 flexibly maps scan-in test pads to scan input channels and scan output channels to scan-out test pads according to a configurable mapping scheme.

According to aspects of the disclosure, scan test circuitry 524 can be configured to implement pad-channel communicative coupling according to a scan configuration. According to aspects of the disclosure, the scan configuration can define a current mapping of the configurable mapping scheme, and the current mapping can be reconfigured by modifying the scan configuration. In some implementations, the scan configuration can be stored in a set of configuration registers in integrated circuit 500.

The set of configuration registers can include a respective configuration register 515 for each one of the scan-in test pads 40a to 40f of integrated circuit 500. A value/state of each such configuration register 515 can specify a respective scan input channel to which its associated scan-in test pad is allocated. The set of configuration registers can additionally or alternatively include a respective configuration register 552 for each one of the scan output channels implemented in integrated circuit 500 (scan output channels 345A-1, 345A-2, 345B-1, 345B-2, 345C-1, and 345C-2 in the depicted example). A value/state of each such configuration register 552 can specify the respective scan-out test pad to which its associated scan output channel is allocated.

According to aspects of the disclosure, using the flexible coupling capabilities of scan test circuitry 524, any given scan-in test pad can be communicatively coupled with any scan input channel. For instance, scan-in test pads 40a and 40f can be communicatively coupled with scan input channels 325C-1 and 325A-2, respectively, such that signals 51a and 51f received via respective scan-in test pads 40a and 40f are conveyed to respective scan input channels 325C-1 and 325A-2 (rather than being conveyed to respective scan input channels 325A-1 and 325C-2, as they would be according to the static mapping in FIG. 4). Similarly, scan output channels 345A-2 and 345B-2 can be communicatively coupled with scan-out test pads 48t and 48p, respectively, such that signals 57b and 57d received via respective scan output channels 345A-2 and 345B-2 are conveyed to respective scan-out test pads 48t and 48p (rather than being conveyed to respective scan-out test pads 48q and 48s, as they would be according to the static mapping in FIG. 4).

The programmable I/O allocation capabilities of integrated circuit 500 can lend flexibility to the allocation of core circuitry blocks such as 340-1 to 340-16 of core circuitry 322 to scan domains. This flexibility can reduce the design burden associated with allocating blocks to scan domains, can enable optimization of the scan test suite (e.g., with respect to test volume, power, cost, time) and can enable overcoming scan test limitations discovered post tape-out stage (e.g., I/Os issues—such as inoperability, performance, etc., core circuitry blocks crosstalk, etc.) at any stage throughout the device lifetime.

Figure 6:
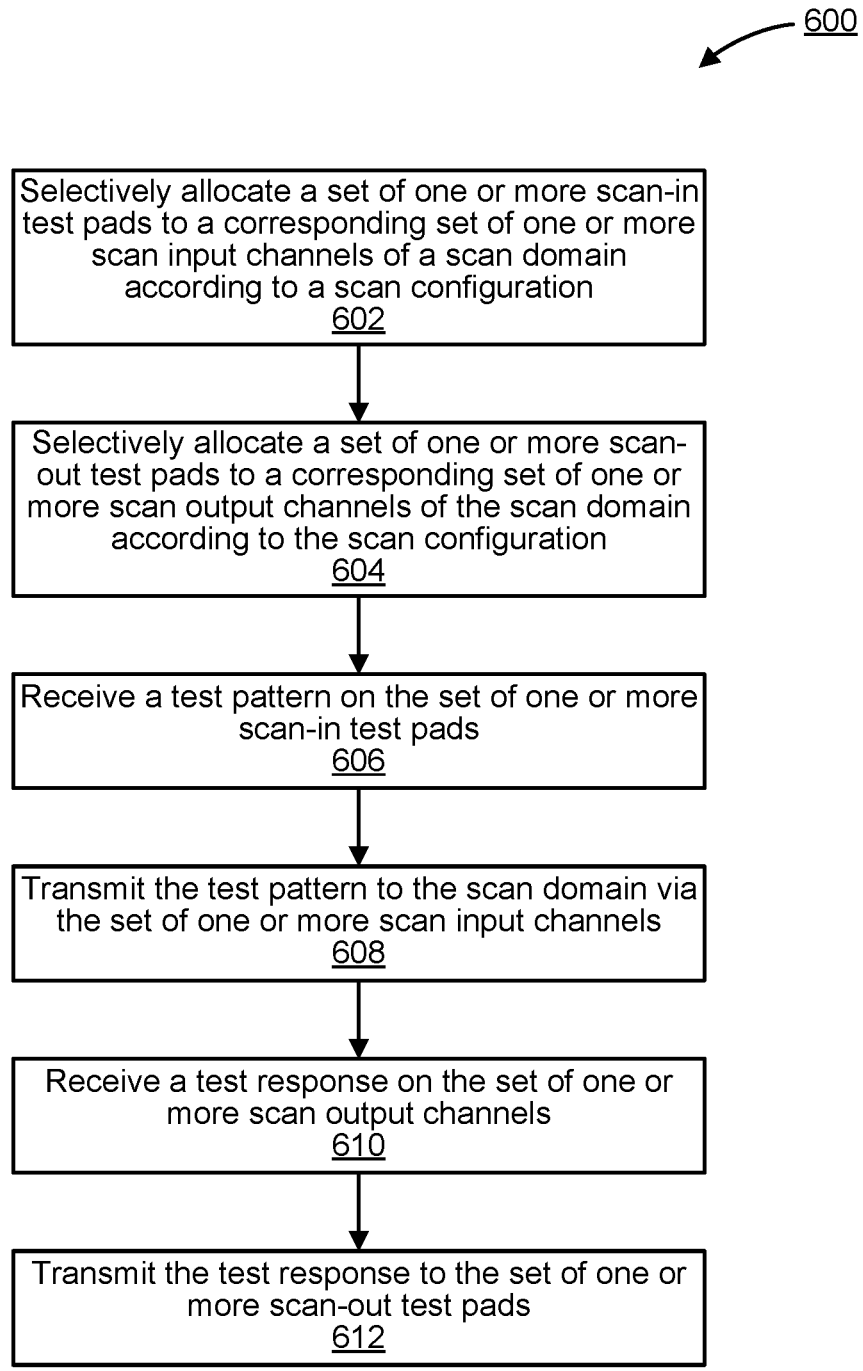
FIG. 6 is a flowchart illustrating an example of a process for scan testing a scan domain.

FIG. 6 includes a flowchart illustrating an example of a process 600 for scan testing a scan domain of an integrated circuit. According to aspects of the disclosure, process 600 can be implemented in integrated circuit 500 of FIG. 5, and operations of process 600 may be performed by scan test circuitry 524.

At step 602, the process 600 includes selectively allocating a set of one or more scan-in test pads to a corresponding set of one or more scan input channels of a scan domain according to a scan configuration. According to aspects of the disclosure, the scan domain can include a set of core circuitry blocks of the integrated circuit. For example, scan test circuitry 524 of integrated circuit 500 of FIG. 5 can selectively allocate scan-in test pad 40f to scan input channel 325A-2 of scan domain 335A according to a scan configuration, and scan domain 335A can include a set of core circuitry blocks among those of the core circuitry 322 of integrated circuit 500. In some implementations, the set of core circuitry blocks can include at least one processing circuitry block, at least one memory circuitry block, or a combination of both.

At step 604, the process 600 includes selectively allocating a set of one or more scan-out test pads to a corresponding set of one or more scan output channels of the scan domain according to the scan configuration. For example, scan test circuitry 524 of integrated circuit 500 of FIG. 5 can selectively allocate scan output channel 345A-2 of scan domain 335A to scan-out test pad 48t according to the scan configuration.

According to aspects of the disclosure, a scan domain is configured to include any set of core circuitry blocks of the integrated circuit in steps 602 and 604 and mapped to any set of test pads.

Following step 604, scan testing of the scan domain can be conducted via operations performed in steps 606, 608, 610, and 612.

In some implementations, the scan configuration can be stored in a set of configuration registers in the integrated circuit. For instance, a scan configuration for integrated circuit 500 can be stored in the set of configuration registers 515 and 552 of integrated circuit 500. In some implementations, the set of configuration registers can be programmed via a JTAG interface. For example, a tester device such as tester 110 of FIG. 1 can program the set of configuration registers 515 and 552 of integrated circuit 550 via a JTAG interface. The set of configuration registers can also be programmed using other interfaces. In some implementations, firmware or software executing on the integrated circuit or a system component communicating with the integrated circuit can program the configuration registers.

In some implementations, the set of configuration registers can include a respective configuration register for each scan-in test pad of the integrated circuit to select which scan input channel of the integrated circuit that scan-in test pad is allocated to, and a respective configuration register for each scan output channel of the integrated circuit to select which scan-out test pad of the integrated circuit is allocated to that scan output channel. For example, integrated circuit 500 can include a respective configuration register 515 for each one of scan-in test pads 40a to 40f, and can include a respective configuration register 552 for each one of scan output channels 345A-1, 345A-2, 345B-1, 345B-2, 345C-1, and 345C-2. In some implementations, the set of configuration registers can include a configuration register that is shared across multiple scan-in test pads to collectively assign a group of scan-in test pads, or can include multiple such configuration registers. In some implementations, the set of configuration registers can include a configuration register that is shared across multiple scan-out test pads to collectively assign a group of scan-out test pads, or can include multiple such configuration registers.

At step 606, the process 600 includes receiving a test pattern on the set of one or more scan-in test pads. For example, scan test circuitry 524 of integrated circuit 500 of FIG. 5 can receive a test pattern 51f on scan-in test pad 40f. In some implementations, the integrated circuit can receive the test pattern from automated test equipment.

At step 608, the process 600 includes transmitting the test pattern to the scan domain via the set of one or more scan input channels. For example, scan test circuitry 524 of integrated circuit 500 of FIG. 5 can transmit test pattern 51f to scan domain 335A via scan input channel 325A-2.

At step 610, the process 600 includes receiving a test response on the set of one or more scan output channels. For example, scan test circuitry 524 of integrated circuit 500 of FIG. 5 can receive a test response 57b on scan output channel 345A-2 of scan domain 335A.

At step 612, the process 600 includes transmitting the test response to the set of one or more scan-out test pads. For example, scan test circuitry 524 of integrated circuit 500 of FIG. 5 can transmit test response 57b to scan-out test pad 48t. In some implementations, the integrated circuit can transmit the test response to automated test equipment. It should be noted that instead of using an automated test equipment, the integrated circuit can also be tested by other devices such as a computer or a component such as an ASIC or FPGA coupled to the integrated circuit that is capable of generating a test pattern and receiving a test response.

In some implementations, responsive to a detection of a new scan configuration (e.g., a configuration register being written with a new value), one or more scan-in test pads among a set of one or more scan-in test pads and one or more scan-out test pads among a set of one or more scan-out test pads previously allocated to one scan domain can be allocated to a second scan domain. scan testing of the second scan domain can be performed via the operations in steps 606, 608, 610, and 612. Hence, in this manner, scan testing of different scan domains can be performed using some or all of the same set of I/Os.

In some implementations, if the chip has a large area, to reduce layout and routing congestion for the scan circuitry, the scan circuitry can be partitioned such that different scan circuitry partitions can be used to test different areas of the chip. For example, the chip area can be divided into two portions, and each portion of the chip can have its own scan circuitry that can flexibly allocate I/Os for scan testing of different core circuitry in the respective portions of the chip. In such implementations, scan testing of a first scan domain in the first portion of the chip can be performed concurrently with the scan testing of a second scan domain in the second portion of the chip.

Figure 7:
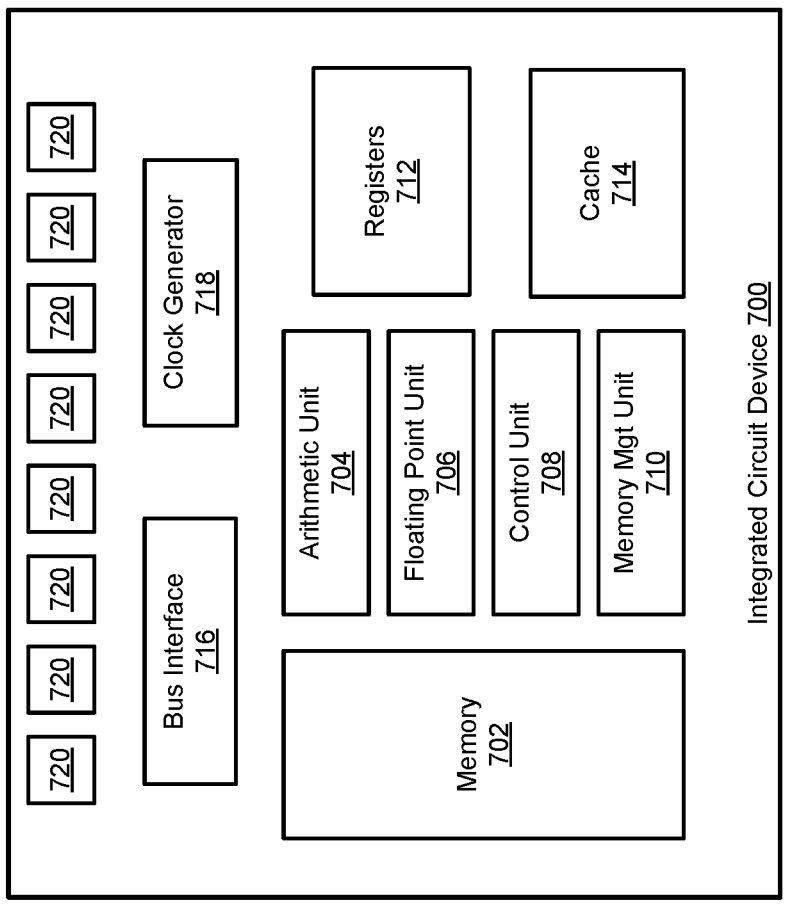
FIG. 7 is a block diagram of an example integrated circuit device.

FIG. 7 is a block diagram of an example integrated circuit device 700 that may implement flexible I/O allocation techniques for scan testing as discussed herein, according to some implementations. In various examples, the integrated circuit device 700 is a semiconductor-based device that includes multiple layers of substrates forming transistors, capacitors, vias, and other circuit elements. In the example of FIG. 7, the integrated circuit device 700 is implemented on a single die. In other examples, the integrated circuit device 700 can be implemented using multiple dies. In still other examples, the integrated circuit device 700 can be a circuit cell, or a design core, in which the scan channel configuration techniques can be implemented. Such as circuit cell can be used in a tiled arrangement of abutted circuit cells as part of a larger integrated circuit device.

The example integrated circuit device 700 includes a memory 702, an arithmetic unit 704, a floating point unit 706, a control unit 708, a memory management unit 710, registers 712, a cache 714, a bus interface 716, a clock generator 718, and multiple I/O pads 720.

The memory 702 can include circuits that are able to store values. For example, the memory 702 can store instructions that are to be executed by the integrated circuit device 700. The memory 702 can be implemented using, for example, a variety of Static Random Access Memory (SRAM). In some examples, the memory 702 may be small, in view of the limited amount of space in the integrated circuit device 700.

The arithmetic unit 704 may be configurable to perform arithmetic or logical operations. The arithmetic unit 704 can be configured, for example, to read operands from one or more of the registers 712, and to place results in a register.

The floating point unit 706 can perform floating point arithmetic. The floating point unit 706 can also be configured to read operations from the registers 712 and to write results to the registers 712.

The control unit 708 can include circuitry for executing instructions and/or for coordinating the activities of the other blocks in the integrated circuit device 700. For example, the control unit 708 can configure the registers from which arithmetic unit 704 is to read operands, as well as the operation the arithmetic unit 704 is to perform on the operands. The control unit 708 can further instruct the arithmetic unit 704 where to place a result of the operation. As a further example, the control unit 708 can write data into the registers 712, and read data from the registers 712, possibly to move the data to the memory 702 and/or elsewhere.

The memory management unit 710 can manage the memory 702, the cache 714, and possibly also the registers 712. The memory management unit 710 can, for example, cause data to be moved from the memory 702 to the cache 714, or vice versa. As a further example, the memory management unit 710 can cause data to be moved from the cache 714 to an external memory, or vice versa. In various examples, the operations that the memory management unit 710 performs are controlled by the control unit 708. For example, when the control unit 708 determines that the integrated circuit device 700 is ready for new instructions to be loaded into the memory 702, the control unit 708 can instruct the memory management unit 710 to obtain the instructions from an external memory.

The registers 712 can provide temporary storage for values being operated on by the integrated circuit device 700. Compared to the memory 702, each register is quite small, storing, for example, one data word each (where a data word can be 16, 32, 64, or another number of bits long). Each register is also directly accessible, such that the number of registers may be limited by the wiring required for each to be independently readable and writeable. Because the registers 712 are directly accessible and can be read or written faster than the memory 702, it may be preferable for values being operated on by, for example, the arithmetic unit 704 or the point unit 706 to be in the registers 712, rather than in the memory 702.

The cache 714 is a memory where data that was recently used by the integrated circuit device 700, and/or that may soon need to be used, can be stored. The data may, for example, have been in the memory 702, was operated on by the control unit 708, and then was moved to the cache 714 to make space in the memory 702 for new data. As another example, the integrated circuit device 700 may have needed a particular data word, which the memory management unit 710 may have loaded into the cache 714 along with a set of data words (e.g., a cache line), under the assumption that the integrated circuit device 700 may need a data word that was stored in external memory next to the particular data word. The cache 714 can thus save time by reducing how frequently the integrated circuit device 700 needs to access external memory. Determining when data needs to be loaded into the cache from an external memory, and/or when data needs to be moved out of the cache, can be handled by the memory management unit 710.

The bus interface 716 can include circuitry that enables the integrated circuit device 700 to communicate with other devices, such as external memories. The bus interface 716 can implement various protocols, such as Advanced eXtensible Interface (AXI), Advanced High-performance Bus (AHB), Peripheral Component Interconnect (PCI), or another bus protocol. The bus interface 716 can be connected to the I/O pads 720 to enable the bus interface 716 to communicate with external devices. In various examples, the integrated circuit device 700 can include multiple bus interfaces, which may implement different protocols.

The clock generator 718 can generate one or more clock signals for the integrated circuit device 700, which may have different frequencies. In some examples, the clock generator 718 operates off of a clock input to the integrated circuit device 700 (received at one of the I/O pads 720), which the clock generator 718 can use to generate clock signals of different frequencies.

The I/O pads 720 can include circuitry for connecting the integrated circuit device 700 to the physical pins or balls of the package that encloses the integrated circuit device 700. The pins or balls (e.g., drops of conductive material) can connect the integrated circuit device 700 to a printed circuit board. Some of the I/O pads 720 can be for inputting signals into the integrated circuit device 700, others can be for outputting signals from the integrated circuit device 700, and/or others can be bi-directional. In most cases, the I/O pads 720 are present along most of the edges of the integrated circuit device 700, but only a few are illustrated here, for the sake of clarity.

These blocks illustrated in FIG. 7 provide examples of blocks that can be found in an integrated circuit device, and are intended only to be illustrative. In other examples, an integrated circuit device can include components that are not illustrated here, can include multiple instances of a component, and/or can lack some of the components that are included in this illustration. The arrangement and spacing of the blocks are also not intended to be representative of the arrangement and spacing that may be found in an actual device. The arrangement and spacing have been selected only for the convenience of the illustration.

Figure 8:
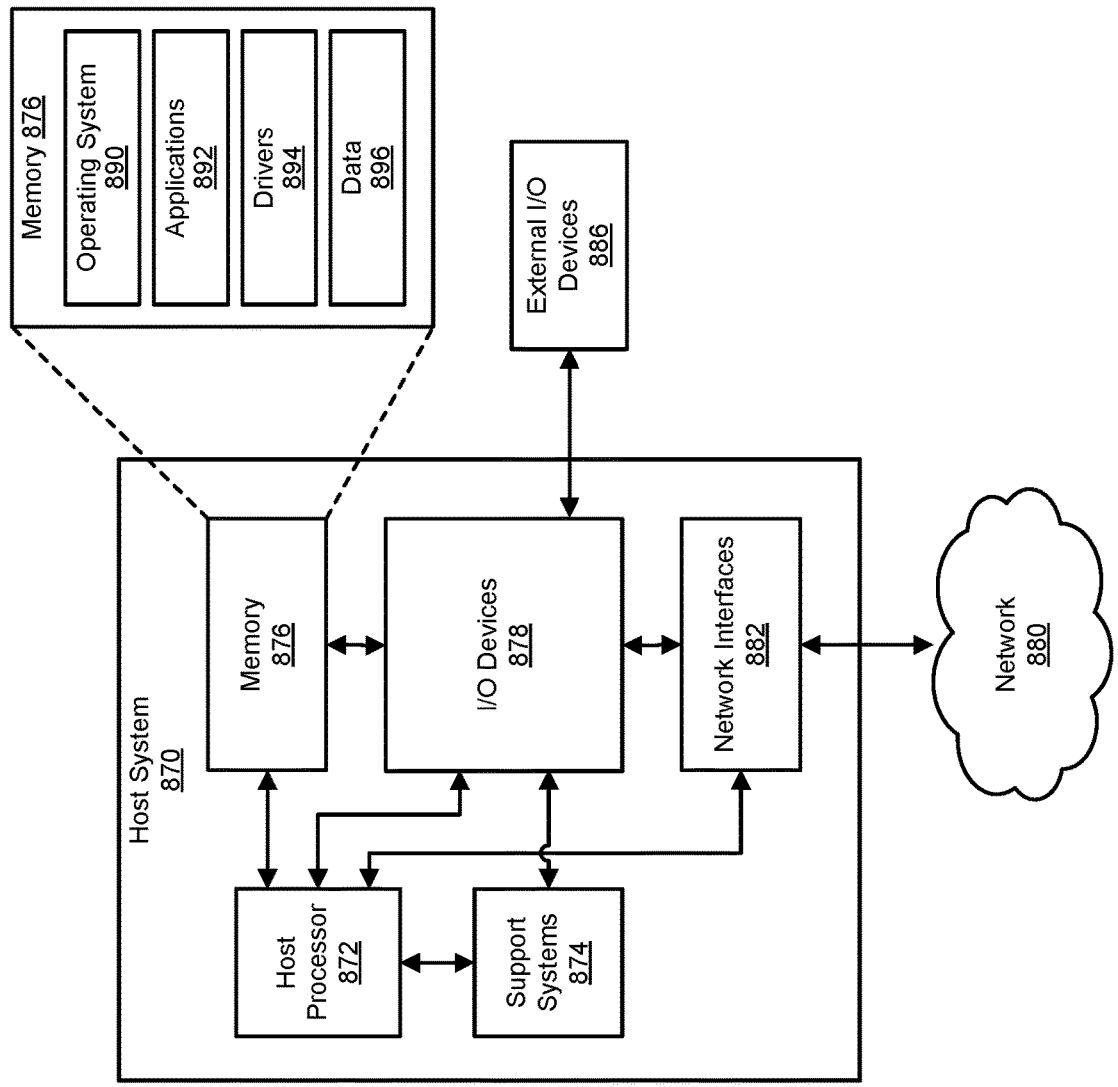
FIG. 8 is a block diagram of an example host system.

FIG. 8 is a block diagram of an example host system 870 having one or more integrated circuits that can be tested using the flexible I/O allocation scan techniques disclosed herein. In some examples, the host system 870 of FIG. 8 can be used to implement a general purpose computer, such as a desktop computer, a laptop computer, a server computer, a thin client, and so on. In some examples, the host system 870 can be used to implement mobile computing devices, such as a mobile phone, a smart phone, a personal digital assistant (PDA), or a tablet computer, among other examples. In some examples, the host system 870 can be used to implement somewhat more special purpose devices, such as home assistants, gaming consoles, electronic books (e-books), media centers, and so on. In some examples, the host system 870 can be used to implement computing devices incorporated into appliances, automobiles and other vehicles, robots, and other electronic devices. The system 870 can also be an example of a computer system that can implement embodiments of the method described in FIG. 6.

The example host system 870 of FIG. 8 includes a host processor 872, processor memory 876, input/output (I/O) devices 878, network interfaces 882, and various support systems 874. In various implementations, the host system 870 can include other hardware that is not illustrated here.

The host processor 872 is a general purpose integrated circuit that is capable of executing program instructions. In some examples, the host processor 872 can include multiple processing cores. In a multi-core processor, each core may be able to independently execute program code. In some examples, the cores may share resources, such as buses and caches. In some examples, the host processor 872, whether single core or multi-core, may be a multi-threaded processor, in which case the host processor 872 can execute multiple threads of execution (e.g., independent sets of program code) at the same time. In some examples, the host system 870 can include more than one host processor 872.

The memory 876 can include memory that is used by the host processor 872 for storage of program code that the host processor 872 is in the process of executing, as well as for storage of values that are being operated on by the host processor 872. For example, the memory 876 can be storing an operating system 890, one or more applications 892, one or more device drivers 894, and data 896 associated with the operating system 890, the applications 892, and/or the drivers 894. In various examples, memory 876 can be implemented using volatile memory types (such as Random Access Memory (RAM) type memories) and/or non-volatile memory types (such as Read-Only Memory (ROM), flash memory, etc.). In some examples, some or all of the memory 876 may be accessible to the I/O devices 878. The processor memory 876 is often referred to as DRAM, though the actual implementation of the memory may not make use of Dynamic Random Access Memory.

The operating system 890 can coordinate the activities of the hardware of the host system 870, as well as the activities of the applications 892 and drivers 894. For example, the operating system 890 can perform operations such as scheduling tasks, executing applications, or controlling peripheral devices. In some examples, the operation system 890 can include a hypervisor which can support the operation of virtual machines on the host system 870. In some examples, the hypervisor runs as kernel space application. In these and other examples, each virtual machine can execute an independent operating system, and may have different virtual hardware configurations. Examples of operating systems include Unix, Linux, Windows, Mac OS, iOS, Android, and the like. The operating system 890 may also be a proprietary operating system.

The applications 892 can enable a user to interact with the host system 870 and/or with systems on the network 880. The applications 892 can include user space applications, such as web browsers, text editors, video or audio players, and so on. Each of the applications 892 can be embodied as program code, or instructions that, when executed, cause the host processor 872 to perform operations that implement the applications 892. In various examples, the code for the applications 892 can be stored on a non-volatile storage medium, such as a disk drive, and can be copied into the memory 876 when being executed.

The drivers 894 can include programs that manage communications between the operating system 890 and/or applications 892 and hardware components of the host system 870, such as the I/O devices 878 and network interfaces 882.

For example, a driver can provide an Application Programming Interface (API) that provides abstract commands for using the functions of an I/O device. In this example, the API may be standardized, and the driver may be able to translate the abstract commands to specific commands for a particular I/O device. Drivers are often kernel space applications, so that user-space code may be prevented from accidentally or intentionally misusing the hardware of the host system 870.

The data 896 can include data used and/or operated on by the operating system 890, applications 892, and/or drivers 894. Examples of such data include web pages, video data, audio data, images, user data, and so on. Alternatively or additionally, the data 896 can include software libraries that may be used by the operating system 890, applications 892, and/or drivers 894. In some examples, the data 896 may be accessible to systems on the network 880.

The I/O devices 878 can include hardware that adds functionality to the example host system 870. For example, the I/O devices 878 can include non-volatile storage devices, such as solid state drives, magnetic drives, optical drives, and/or tape drives, among other examples. The I/O devices 878 can further include accelerators such as graphics accelerators, and other, more special purpose, devices. As another example, the I/O devices 878 can include hardware for connecting to external I/O devices 886, such as keyboards, monitors, printers, and external storage drives among other devices. The network interfaces 882 are also I/O devices, though are illustrated separately here for the sake of clarity. Herein, some I/O devices may also be referred to as peripheral devices. In various examples, an I/O device can include a processor and memory that are additional to the host processor 872 and memory 876 of the host system 870. The processor of the I/O device may operate independently of the host processor 872, or may be used by the host processor 872 for various purposes. For example, the I/O device can include a Graphics Processing Unit (GPU), which the host processor 872 can use for large computations. In some examples, the host system 870 can also be connected to external I/O devices 886, such as external hard drives.

In some examples, one or more of the I/O devices 878 can be based on one of the Peripheral Component Interconnect (PCI) standards. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices in a host system. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the host system 870 can include a storage device that implements NVMe as the primary communication interface.

A PCI-based device can include one or more functions. A "function" describes operations that may be provided by the device. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, a PCI-based device can include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to the operating system 890 and/or applications 892 to be multiple devices providing the same functionality. The functions of an SR-IOV-capable device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host system 870.

The network interfaces 882 can enable the host system 870 to communicate with a network 880 or with multiple networks. The network interfaces 882 can include, for example, one or more network interface cards (NICs). The network interfaces 882 can include, for example, physical ports for connecting to a wired network. Alternatively or additionally, the network interfaces 882 can include antennas for connecting to a wireless network. In some examples, the network interfaces 882 can include more than one physical port, and/or more than one antenna, so that the host system 870 can communicate with multiple networks at the same time.

The support systems 874 can include various hardware that supports the operations of the host processor 872 and/or the I/O devices 878. For example, the support systems 874 can include a boot ROM that stores the code for the Basic Input/Output System (BIOS) of the host system 870, and that enables the host system 870 to boot from being powered on. As another example, the various support systems 874 can include a power supply and power subsystem. Other devices that may be found in the support systems 874 can include a Board Management Controller (BMC) and/or various other volatile or non-volatile memories.

The host system 870 can further include one or more busses 884, which may also be referred to as interconnects. The busses 884 can enable the various components of the example host system 870 to communicate with one another. For example, the busses 884 can include a bus that is dedicated to communications between the host processor 872 and the processor memory 876. As another example, the busses 884 can include an I/O bus, which enables the host processor 872 to communicate with the I/O devices 878, and which may enable the I/O devices 878 to communicate among each other. In some examples, the I/O bus is a PCI-based bus or bus network. The busses 884 can include other busses, such as a power management bus, sideband busses, control busses, and/or dedicated busses between certain components (e.g., a BMC and the host processor 872).

The memory 876, storage devices, and other memories discussed above are each examples of a computer-readable medium. Other examples of computer-readable media include removable storage devices, such as magnetic tapes, floppy disks, Compact Discs (CDs), Digital Versatile Discs (DVDs), Blue-Ray disks, and flash memory drives, among other examples. In each of these examples, the computer-readable medium is capable of storing program code that can be executed by the host processor 872. In some cases, the computer-readable medium may be non-transitory, meaning that the data stored on the computer-readable medium remains stored on the medium when power is not applied to the computer-readable medium. In contrast, when power is removed from a transitory computer-readable medium, such as RAM, the data is deleted from the medium. Examples of a non-transitory computer-readable medium include ROM-based memory, hard disks, removable disks such as those listed above, and flash-based memory, among other examples.

In some implementations, a non-transitory computer-readable medium such as described above can have instructions stored therein for a software testing tool. In some implementations, for instance, such a non-transitory computer-readable medium can have stored therein instructions that, when executed by one or more processors, cause an integrated circuit device to perform operations of process 600 of FIG. 6. In some implementations, in conjunction with the execution of such instructions, a scan configuration can be loaded into configuration registers of the scan test circuitry.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in the preceding figures, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Various examples of this disclosure are described herein, including the best mode known to the inventors for carrying out the disclosure. Variations of those examples may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An integrated circuit device, comprising:
   core circuitry;
   a set of configuration registers; and
   scan test circuitry configured to:
      selectively allocate, according to a first scan configuration stored in the set of configuration registers, a first set of scan-in test pads to a corresponding first set of scan input channels of a first scan domain that includes a first set of core circuitry blocks in the core circuitry, and a first set of scan-out test pads to a corresponding first set of scan output channels of the first scan domain;
      perform scan testing of the first scan domain by receiving a first test pattern on the first set of scan-in test pads, transmitting the first test pattern to the first scan domain via the first set of scan input channels, receiving a first test response on the first set of scan output channels, and transmitting the first test response to the first set of scan-out test pads;
      selectively allocate, according to a second scan configuration stored in the set of configuration registers, a second set of scan-in test pads to a corresponding second set of scan input channels of a second scan domain that includes a second set of core circuitry blocks in the core circuitry, and a second set of scan-out test pads to a corresponding second set of scan output channels of the second scan domain; and perform scan testing of the second scan domain by receiving a second test pattern on the second set of scan-in test pads, transmitting the second test pattern to the second scan domain via the second set of scan input channels, receiving a second test response on the second set of scan output channels, and transmitting the second test response to the second set of scan-out test pads.

2. The integrated circuit device of claim 1, wherein the scan testing of the first scan domain is performed concurrently with the scan testing of the second scan domain.

3. The integrated circuit device of claim 1, wherein:
the second set of scan-in test pads includes at least one scan-in test pad among the first set of scan-in test pads;
the second set of scan-out test pads includes at least one scan-out test pad among the first set of scan-out test pads; or
a combination of both.

4. The integrated circuit device of claim 1, wherein the set of configuration registers includes:
a configuration register for each scan-in test pad of the integrated circuit device to select which scan input channel of the integrated circuit device that the corresponding scan-in test pad is allocated to; and
a configuration register for each scan output channel of the integrated circuit device to select which scan-out test pad of the integrated circuit device is allocated to the corresponding scan output channel.

5. The integrated circuit device of claim 1, wherein the set of configuration registers are programmed via a JTAG interface.

6. An integrated circuit device, comprising:
core circuitry including a plurality of core circuitry blocks; and
scan test circuitry configured to:
selectively allocate a set of one or more scan-in test pads to a corresponding set of one or more scan input channels of a scan domain that includes a set of core circuitry blocks according to a scan configuration;
selectively allocate a set of one or more scan-out test pads to a corresponding set of one or more scan output channels of the scan domain according to the scan configuration; and
perform scan testing of the scan domain by:
receiving a test pattern on the set of one or more scan-in test pads;
transmitting the test pattern to the scan domain via the set of one or more scan input channels;
receiving a test response on the set of one or more scan output channels; and
transmitting the test response to the set of one or more scan-out test pads.

7. The integrated circuit device of claim 6, wherein the scan domain is a first scan domain, and the scan test circuitry is configured to:
selectively allocate a second set of one or more scan-in test pads to a corresponding second set of one or more scan input channels of a second scan domain;
selectively allocate a second set of one or more scan-out test pads to a corresponding second set of one or more scan output channels of the second scan domain according to the scan configuration; and
perform scan testing of the second scan domain.

8. The integrated circuit device of claim 6, wherein the scan domain is a first scan domain, and the scan test circuitry is configured to:
selectively allocate a scan-in test pad from the set of one or more scan-in test pads to a second scan domain in response to detecting a new scan configuration.

9. The integrated circuit device of claim 6, wherein the scan configuration is stored in a set of configuration registers in the integrated circuit device.

10. The integrated circuit device of claim 9, wherein the set of configuration registers includes a configuration register for each scan-in test pad of the integrated circuit device to select which scan input channel of the integrated circuit device that the corresponding scan-in test pad is allocated to.

11. The integrated circuit device of claim 9, wherein the set of configuration registers includes a configuration register for each scan output channel of the integrated circuit device to select which scan output test pad of the integrated circuit device is allocated to the corresponding scan output channel.

12. The integrated circuit device of claim 11, wherein the set of configuration registers includes one or both of:
a configuration register shared across multiple scan-in test pads; and
a configuration register shared across multiple scan-out test pads.

13. The integrated circuit device of claim 6, wherein the set of core circuitry blocks includes at least one processing circuitry block, at least one memory circuitry block, or a combination of both.

14. The integrated circuit device of claim 6, wherein the scan test circuitry is configured to perform scan testing on all scan domains of the integrated circuit device by repeatedly performing selective allocation of the set of one or more scan-in test pads and the set of one or more scan-out test pads to each scan domain.

15. A method for scan testing an integrated circuit device, the method comprising:
selectively allocating, according to a scan configuration, a set of one or more scan-in test pads to a corresponding set of one or more scan input channels of a scan domain that includes a set of core circuitry blocks among a plurality of core circuitry blocks of the integrated circuit device;
selectively allocating, according to the scan configuration, a set of one or more scan-out test pads to a corresponding set of one or more scan output channels of the scan domain; and
performing scan testing of the scan domain by:
receiving a test pattern on the set of one or more scan-in test pads;
transmitting the test pattern to the scan domain via the set of one or more scan input channels;
receiving a test response on the set of one or more scan output channels; and
transmitting the test response to the set of one or more scan-out test pads.

16. The method of claim 15, wherein the scan domain is a first scan domain, the method comprising:
selectively allocating a second set of one or more scan-in test pads to a corresponding second set of one or more scan input channels of a second scan domain;
selectively allocating a second set of one or more scan-out test pads to a corresponding second set of one or more scan output channels of the second scan domain according to the scan configuration; and performing scan testing of the second scan domain.

17. The method of claim 15, wherein the scan domain is a first scan domain, the method comprising:

selectively allocating a scan-in test pad from the set of one or more scan-in test pads to a second scan domain in response to detecting a new scan configuration.

18. The method of claim 15, wherein the scan configuration is stored in a set of configuration registers in the integrated circuit device.

19. The method of claim 18, wherein the set of configuration registers includes a configuration register for each scan-in test pad of the integrated circuit device to select which scan input channel of the integrated circuit device that the corresponding scan-in test pad is allocated to.

20. The method of claim 18, wherein the set of configuration registers includes a configuration register for each scan output channel of the integrated circuit device to select which scan output test pad of the integrated circuit device is allocated to the corresponding scan output channel.

21. The method of claim 15, wherein the test pattern is received from an automated test equipment, and the test response is transmitted to the automated test equipment.

22. The method of claim 15, wherein the scan configuration provides a configurable definition of which of the plurality of core circuitry blocks belong to the scan domain under test, and a mapping of the set of core circuitry blocks under test to the set of one or more scan-in test pads and the set of one or more scan-out test pads.

23. A non-transitory computer-readable medium having stored therein instructions which, when executed by one or more processors, cause the one or more processors to configure an integrated circuit device to:

selectively allocate, according to a scan configuration, a set of one or more scan-in test pads to a corresponding set of one or more scan input channels of a scan domain that includes a set of core circuitry blocks among a plurality of core circuitry blocks of the integrated circuit device;

selectively allocate, according to the scan configuration, a set of one or more scan-out test pads to a corresponding set of one or more scan output channels of the scan domain;

transmit a test pattern from the set of one or more scan-in test pads to the scan domain via the set of one or more scan input channels; and transmit a test response from the set of one or more scan output channels to the set of one or more scan-out test pads.

\* \* \* \* \*